US008900981B2

(12) United States Patent
Forster et al.

(10) Patent No.: US 8,900,981 B2
(45) Date of Patent: Dec. 2, 2014

(54) METHOD FOR DOPING A SEMICONDUCTOR MATERIAL

(75) Inventors: Maxime Forster, Lyons (FR); Erwann Fourmond, Villeurbanne (FR); Jacky Stadler, Reignier (FR); Roland Einhaus, Bourgoin Jallieu (FR); Hubert Lauvray, La Garenne Colombes (FR)

(73) Assignees: Apollon Solar, Lyons (FR); Siltronix, Archamps (FR)

( * ) Notice: Subject to any disclaimer, the term of this patent is extended or adjusted under 35 U.S.C. 154(b) by 0 days.

(21) Appl. No.: 13/810,622

(22) PCT Filed: Jul. 1, 2011

(86) PCT No.: PCT/FR2011/000385
§ 371 (c)(1),
(2), (4) Date: Jan. 16, 2013

(87) PCT Pub. No.: WO2012/007653
PCT Pub. Date: Jan. 19, 2012

(65) Prior Publication Data
US 2013/0115762 A1    May 9, 2013

(30) Foreign Application Priority Data
Jul. 16, 2010 (FR) ...................... 1003009

(51) Int. Cl.
*H01L 21/04* (2006.01)
*H01L 21/324* (2006.01)
*C30B 11/04* (2006.01)
*C30B 15/04* (2006.01)

(52) U.S. Cl.
CPC .............. *H01L 21/324* (2013.01); *C30B 11/04* (2013.01); *C30B 15/04* (2013.01)

USPC 438/510; 438/695; 257/E21.17; 257/E21.159; 117/200; 117/206; 117/208

(58) Field of Classification Search
USPC .............. 438/46, 99, 510, 695; 257/168, 612, 257/E21.17, E21.159; 117/13–21, 208–214
See application file for complete search history.

(56) References Cited

U.S. PATENT DOCUMENTS

| | | | | |
|---|---|---|---|---|
| 4,789,596 A | * | 12/1988 | Allen et al. ................... | 428/404 |
| 5,406,905 A | * | 4/1995 | Yemane-Berhane et al. ... | 117/19 |
| 6,179,914 B1 | * | 1/2001 | Aydelott ....................... | 117/200 |
| 2001/0015167 A1 | * | 8/2001 | Weber et al. .................. | 117/11 |

FOREIGN PATENT DOCUMENTS

| | | |
|---|---|---|
| DE | 10 2005 032 790 A1 | 12/2006 |
| JP | 04046097 A * | 2/1992 |
| JP | A-04-046097 | 2/1992 |
| WO | WO 2009014962 A1 * | 1/2009 |

OTHER PUBLICATIONS

Jun. 20, 2012 International Preliminary Report on Patentability issued in International Patent Application No. PCT/FR2011/000385 (with translation).

* cited by examiner

*Primary Examiner* — Charles Garber
*Assistant Examiner* — Abdulfattah Mustapha
(74) *Attorney, Agent, or Firm* — Oliff PLC

(57) ABSTRACT

A feedstock of semiconductor material is placed in a crucible. A closed sacrificial recipient containing a dopant material is placed in the crucible. The content of the crucible is melted resulting in incorporation of the dopant in the molten material bath. The temperature increase is performed under a reduced pressure.

6 Claims, 1 Drawing Sheet

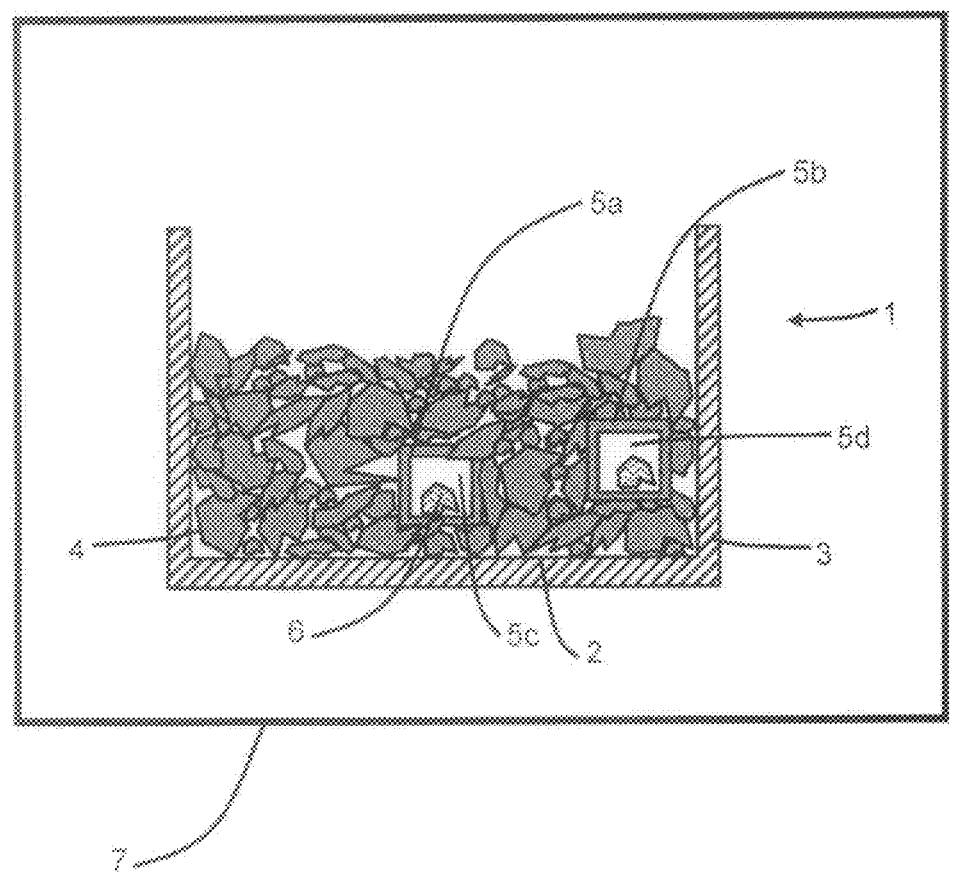

METHOD FOR DOPING A SEMICONDUCTOR MATERIAL

BACKGROUND OF THE INVENTION

The invention relates to a method for doping a semiconductor material.

STATE OF THE ART

In the field of electronics and photovoltaics, it is important to control the quantity of doping impurities present within the crystalline matrix of a semiconductor material.

Faced with the difficulty of producing a semiconductor material comprising the required concentrations of electrically active impurities, the industry has chosen to eliminate the latter in order to obtain very weakly doped materials. Once the material has been rid of these impurities, it is shaped and then doped again with other techniques which ensure better control of the dopant level.

This production method is lengthy and costly as it requires elimination of dopant impurities which will subsequently be reintroduced at the required concentration.

When dopants are to be incorporated in a semiconductor material, these dopants are incorporated, before crystallization, either in the molten feedstock or in the feedstock before the melting step. However, in both cases, the final quantity of dopants in the crystallized semiconductor material does not always correspond to the quantity deposited in the crucible. Different methods for incorporating the dopants are commonly used, but these methods are all associated with risks of contamination and/or with problems of controlling the exact quantity of incorporated dopants. Likewise, the distribution of dopants in the crucible is not homogenous which gives rise to inequalities as far as the electric properties in the semiconductor material are concerned.

OBJECT OF THE INVENTION

It is ascertained that a requirement exists to provide a method for doping semiconductor materials that is easy to implement, is economical and ensures good mastery of the quantity of incorporated dopants.

The method according to the invention is characterized by the fact that it comprises the following steps:
 providing a crucible containing a feedstock of said semiconductor material,
 disposing a dopant material in a closed sacrificial recipient, the sacrificial recipient being formed by said semiconductor material,
 melting the content of the crucible.

BRIEF DESCRIPTION OF THE DRAWINGS

Other advantages and features will become more clearly apparent from the following description of particular embodiments of the invention given for non-restrictive example purposes only and represented in the appended drawings, in which the single figure, in schematic manner in cross-section, represents a crucible containing a feedstock of semiconductor material provided with a sacrificial recipient having a cavity, where a portion of the cavity is hollow.

DESCRIPTION OF A PREFERRED EMBODIMENT OF THE INVENTION

As illustrated in FIG. 1, crucible 1 comprises a bottom 2 and side walls 3. Crucible 1 is filled by a feedstock 4 of semiconductor material. The semi-conductor material is for example silicon, a silicon-germanium alloy, SiC, a binary compound of III-V or II-VI type such as GaAs or CdTe, or a ternary compound of III-V or II-VI type such as AlGaAs or HgCdTe.

Depending on the targeted technological sector, feedstock 4 of semiconductor material comprises well-defined electrically active dopant impurity levels. These impurity levels are defined so as to provide a solid semiconductor material compatible with the chosen application. For an application of micro-electronics type, feedstock 4 of semiconductor material is very weakly doped. For an application of photovoltaic type, feedstock 4 of semiconductor material can contain more dopant impurities. The distribution of the impurities in feedstock 4 is free before melting. Feedstock 4 can contain very weakly doped semi-conductor material next to a more strongly doped block of semiconductor material. Feedstock 4 can also contain one or more blocks of dopant material inside crucible 1.

In order, at the outcome, to obtain the required concentration of dopants in the crystallized material, feedstock 4 is analysed in order to measure the quantity of semiconductor material present, the quantity of dopants present and the quantity of impurities to be incorporated. This step can be performed at any time before melting of the charge.

A closed sacrificial recipient 5 containing one or more dopant materials 6 is placed in feedstock 4 of semiconductor material inside crucible 1. In a particular embodiment, a plurality of closed sacrificial recipients 5 are placed in feedstock 4. The recipients can be distributed in any manner or distribution of the latter can be chosen so as to obtain a very good homogeneity, right from the beginning of melting. The additional sacrificial recipient present in the feedstock can contain the same dopant or mixture of dopant as the sacrificial recipient. In another embodiment, the additional sacrificial recipient contains different dopants from the sacrificial recipient.

The use of several recipients $5a$, $5b$ each having a cavity $5c$, $5d$, respectively, (where a portion of the cavity ($5c$, $5d$) is hollow), the cavity ($5c$, $5d$) of each recipient containing the same dopants or different dopants enhances the homogeneity in the molten charge. This also enables recipients $5a$, $5b$ having different melting temperatures to be used, thereby enabling the dopants to be incorporated gradually in the feedstock or avoiding simultaneous incorporation of two different dopants. It is then advantageous to use sacrificial recipients 5 which present different melting temperatures from one another.

Recipient 5 is sacrificial as it will be melted to form part of feedstock 4 in liquid state which will give the crystallized semiconductor material. Sacrificial recipient 5 is formed by a material forming a part of feedstock 4. The material constituting closed recipient 5 is preferably the semiconductor material to be melted. This semiconductor material can be doped or not. However, it is also possible for closed recipient 5 to be formed by another material, for example by a doping impurity to be incorporated.

In a preferred embodiment, sacrificial recipient 5 is formed from a material which presents a melting temperature that is close to or equal to the melting temperature of the main constituent of feedstock 4 to be melted. In this way, sacrificial recipient 5 is not degraded before being surrounded and/or capped by a sufficient quantity of molten material originating from feedstock 4.

In preferential manner, the dimensions of sacrificial recipient 5 are also chosen such that release of the dopant material 6 takes place when a sufficient quantity of molten material is present. The dimensions of the recipient are dependent on the granulometry of the dopant. In preferential manner, the volume of recipient 5 is comprised between a few cubic millimeters and a few cubic centimeters. However, larger dimensions are usable even if it becomes preferable to work with several recipients 5.

Once feedstock 4 of semiconductor material has been placed in crucible 1 with closed recipient 5 containing one or more dopants, feedstock 4 is melted. Sacrificial recipient 5 is also melted, which releases dopants 6 placed inside recipient 5. In this manner, dopant impurities 6 are incorporated in the molten bath inside crucible 1. The whole content of crucible 1 is melted and is used for forming the crystallized semiconductor material.

The use of a closed sacrificial recipient 5 containing at least one dopant impurity 6 is particularly advantageous. Dopant impurity 6 can be in the state of a pure body or an alloy.

When sacrificial recipient 5 presents an identical or substantially identical melting temperature to that of the rest of feedstock 4, dopant material 6 is incorporated directly in molten feedstock 4. This greatly reduces problems of evaporation of the dopant materials when the temperature gradient of crucible 1 takes place, for example when dopants present a lower melting temperature than that of the semiconductor material constituting the feedstock are to be incorporated. This embodiment can be improved by rendering sacrificial recipient 5 hermetically tight.

The use of a tight recipient is even more advantageous when crucible 1 is located in an enclosure 7 at sub-atmospheric pressure and even in a vacuum. For example purposes, this embodiment is particularly advantageous when the working pressure is comprised between atmospheric pressure and $10^{-5}$ mbar. Working at low pressure is difficult or even impossible when it is sought to incorporate dopants 6 having a high saturating vapor pressure, for example gallium or phosphorus.

It is then possible to perform a temperature increase of feedstock 4 at reduced pressure, typically within the pressure range defined above, so as to eliminate the parasitic impurities and to then perform melting at a higher pressure in order to prevent evaporation of dopant impurities 6 deliberately incorporated in feedstock 4.

As dopant impurities 6 are placed directly in the molten bath, incorporation thereof in the semiconductor material is better controlled. This results in a greater precision in the quantity of dopants present in the final material as losses are reduced, and also results in a greater homogeneity of the dopants inside the molten bath and therefore of the crystallized material. Furthermore, dopant impurities 6 being incorporated in crucible 1 before the melting step, it is no longer necessary to incorporate them in the course of the melting method, which eliminates risks of contamination when the impurities are incorporated, for example by means of a stick. This also results in simplification of the equipment usable to perform melting of feedstock 4.

A sacrificial recipient 5 containing dopants 6 can be used in a large number of technologies comprising incorporation of a solid material in the crucible, melting of this solid material and solidification of the latter.

Conventional dopants of semiconductor material can be incorporated in sacrificial recipient 5, for example boron, phosphorus, gallium, indium and germanium. In advantageous manner, the dopants presenting a low melting point compared with the rest of the feedstock and/or an equilibrium vapor pressure incompatible with the melting method are encapsulated in recipient 5.

Sacrificial recipient 5 is produced by any suitable technique, for example by tapping a block of semiconductor material constituting feedstock 4 or by means of another machining technique.

Sacrificial recipient 5 can be formed by a pure material, an alloy or a doped material. Dopant 6 contained in sacrificial recipient 5 is a different material from that of the recipient. In preferential manner, dopant 6 is a pure or substantially pure material.

In a preferred embodiment, sacrificial recipient 5 is arranged inside feedstock 4 rather than in contact with bottom 2, side walls 3 and the top of the charge. In even more preferential manner, sacrificial recipient 5 is arranged between the top third and the bottom third of feedstock 4 to be melted. This enables delayed melting of sacrificial recipient 5 to be obtained compared with feedstock 4. It is also possible to locate the recipient in the bottom third to prevent the recipient from floating too easily.

In an alternative embodiment, the sacrificial recipient or sacrificial recipients are placed in the feedstock after the melting step. In this manner, the dopants are incorporated after melting of the charge. As in the different embodiments, the recipients can incorporate different dopants from one another or mixtures of dopants in order to prevent parasitic reactions. The recipient enables a better incorporation of the dopant in the heart of the feedstock before changing to molten state.

In so far as the quantity of dopants lost by evaporation is reduced, it is possible to obtain a crystallized semiconductor material with an added dopant concentration that is very low and very well mastered.

The invention claimed is:

1. A method for doping a semiconductor material comprising the following steps:
    providing a crucible containing a feedstock of said semiconductor material and a closed sacrificial recipient having a cavity containing a dopant material, the sacrificial recipient being formed by said semiconductor material and being arranged inside the feedstock, wherein a portion of the cavity is hollow; and
    melting the entire content of the crucible.

2. The method according to claim 1, wherein the closed sacrificial recipient is hermetically tight.

3. The method according to claim 2, wherein the crucible is placed in an enclosure operating at sub-atmospheric pressure.

4. The method according to claim 1, wherein the closed sacrificial recipient is located in the bottom third of the feedstock of semi-conductor material.

5. The method according to claim 1, wherein an additional sacrificial recipient is introduced in the feedstock of semiconductor material.

6. The method according to claim 5, wherein the closed sacrificial recipient has a first melting temperature and the additional closed sacrificial recipient has a second melting temperature different from the first melting temperature.

* * * * *